Figure 1:
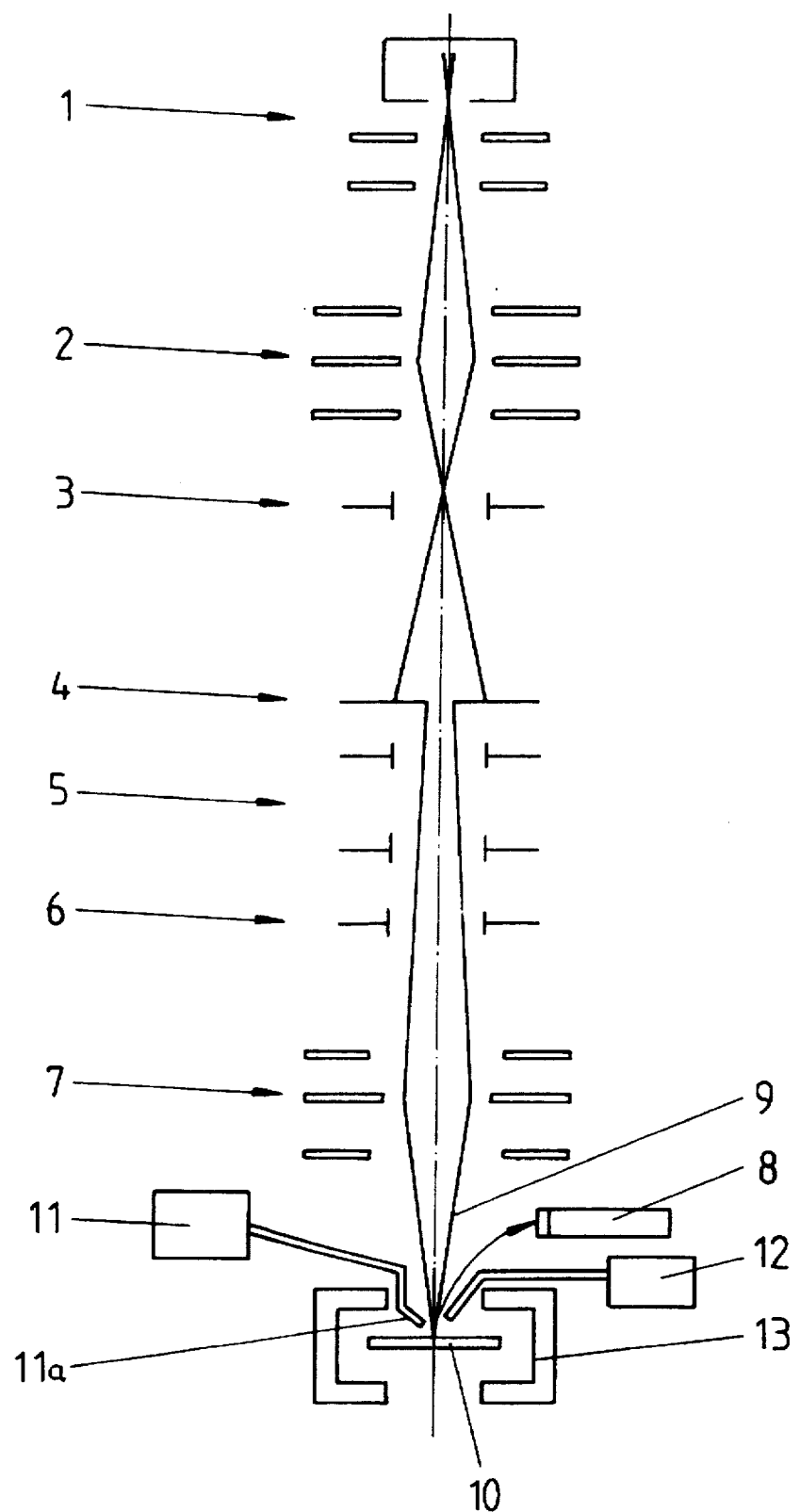

United States Patent [19]

Frosien et al.

[11] Patent Number: 5,637,538
[45] Date of Patent: Jun. 10, 1997

[54] METHOD AND APPARATUS FOR PROCESSING A SPECIMEN

[75] Inventors: Jürgen Frosien, Riemerling; Dieter Winkler; Hans Zimmermann, both of Munich, all of Germany

[73] Assignee: Act Advanced Circuit Testing Gesellschaft Fur, Heimstetten, Germany

[21] Appl. No.: 342,743

[22] Filed: Nov. 21, 1994

[30] Foreign Application Priority Data

Dec. 1, 1993 [DE] Germany .......................... 43 40 956.3

[51] Int. Cl.$^6$ ...................................... H01L 21/302
[52] U.S. Cl. .................... 438/685; 427/596; 427/598; 427/99; 438/708
[58] Field of Search ...................... 437/173, 225; 427/99, 250, 596, 597, 598; 156/643.1, 646.1

[56] References Cited

U.S. PATENT DOCUMENTS

| | | | |
|---|---|---|---|
| 4,394,282 | 7/1983 | Seiver | 252/62.55 |
| 4,472,636 | 9/1984 | Hahn | 250/492.2 |
| 5,345,207 | 9/1994 | Gebele | 335/298 |

OTHER PUBLICATIONS

Shinji Matsui, Toshinari Ichihashi, and Masanobu Mito: "Electron beam induced selective etching and deposition technology" J. Vac. Sci. Technol. B, vol. 7, No. 5 Sep./Oct. 1989.

*Primary Examiner*—R. Bruce Breneman
*Assistant Examiner*—Vanessa Acosta
*Attorney, Agent, or Firm*—Learman & McCulloch

[57] ABSTRACT

The invention relates to a method and to apparatus for processing a specimen, particularly an integrated circuit, in which an area of the specimen to be processed is scanned with a corpuscular beam and at least one gas is supplied above the area to be processed so that with the aid of the corpuscular beam a chemical reaction takes place on the area to be processed. The processing speed can be markedly increased by the use of a magnetic field in the region of the probe.

4 Claims, 5 Drawing Sheets

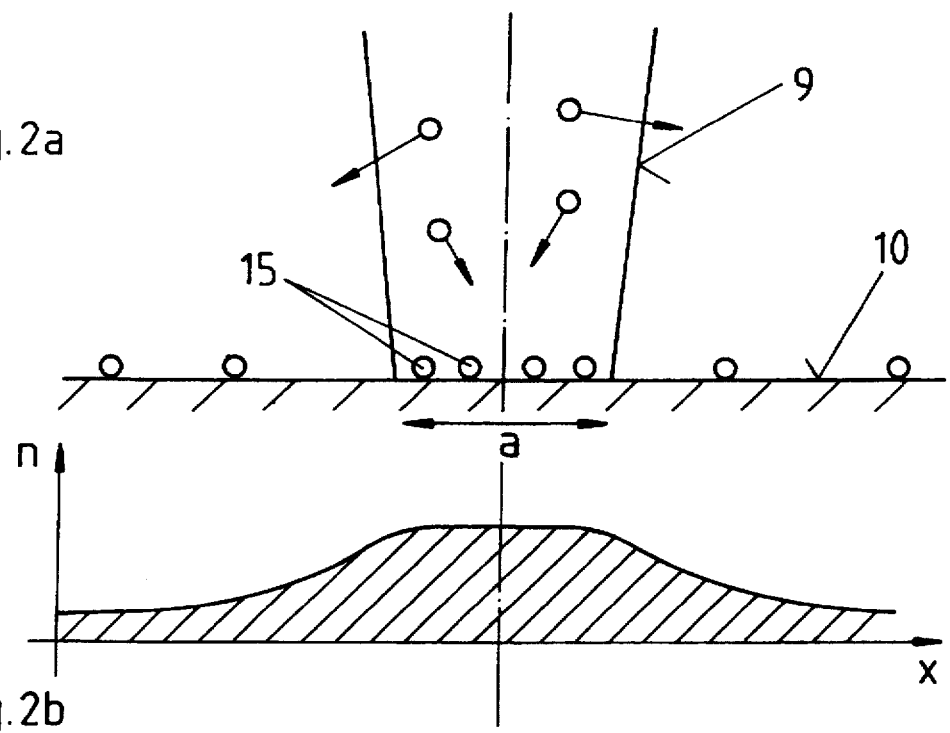
Fig. 2a
Fig. 2b
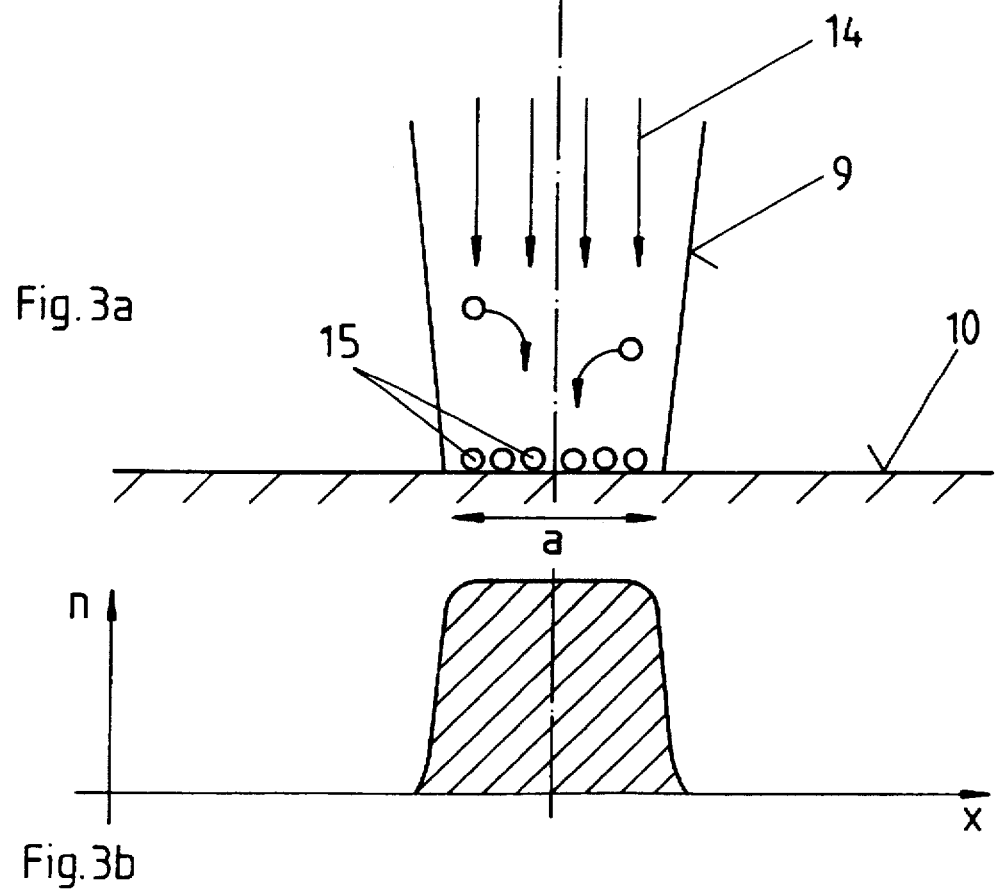
Fig. 3a
Fig. 3b

METHOD AND APPARATUS FOR PROCESSING A SPECIMEN

The invention relates to a method (according to the preamble to claim 1) and to apparatus (according to the generic concept of claim 6) for processing a specimen, particularly an integrated circuit.

It is known to alter integrated circuits, particularly semiconductor circuits, at a later stage by removing or applying structures, for example a part of a conductive track. The geometric dimensions of these alterations are often smaller than one micrometer.

A method according to the preamble to claim 1 is known from Shinki Matsiu, Toshinari Ichihashi and Masanobu, Mito: "Electron beam induced selective etching and deposition technology", J. Vac. Sci. Technol. B 7 (5), September/October 1989, American Vacuum Society. In this method an area of a specimen to be processed is scanned with an electron beam with the aid of an electron beam scanning device. A gas is introduced by means of a thin cannula just above the specimen which is held in a specimen chamber, so that with the aid of a corpuscular beam a chemical reaction takes place on the area to be processed. Depending upon which gas is used, material can be applied to (deposited on) the specimen or removed (etched) from the specimen. The gas $W(CO)_6$, is used for example for the application of material to the specimen, and after interaction with the electron beam tungsten is deposited as a solid material layer on the surface. For removal of material from the specimen a gas is used which after interaction with the corpuscular beam forms with the material of the specimen a volatile reaction product which is then drawn off. The gas used in this case can for example be $XeF_2$, and the fluorine forms the volatile $SiF_4$ with the specimen material silicon.

However, the surface of the specimen or substrate is only altered where gas particles are deposited on the surface after interaction with the corpuscular beam. The speed with which the material is applied to the specimen or removed from the specimen depends upon the number of deposited particles per unit of area and time. This particle density is determined on the one hand by the number of gas particles interacting with the corpuscular beam and on the other hand by the proportion of the particles which are finally deposited in the area to be processed on the specimen.

The total number of gas particles interacting with the corpuscular beam per unit of time is limited by the gas supply, which cannot be increased as required because of the necessary vacuum conditions. Furthermore the supply of electrons in the electron beam is predetermined by the available electron source. In the tests on which the invention is based, however, it has been shown that the chemical reaction on the specimen surface takes place not only in the area which is to be processed and is scanned by the corpuscular beam, but also in the surrounding area, see FIG. 2.

The object of the invention, therefore, is to make further developments to the method according to the preamble to claim 1 and the apparatus according to the generic concept of claim 6 in such a way that the speed of the processing of a specimen brought about by the chemical reaction is increased in the area to be processed.

This object is achieved according to the invention by the characterising feature of claim 1 or claim 6 respectively. In the tests on which the invention is based it has been shown that by the use of a magnetic field in the region of the specimen a marked increased in the etching and deposition rate can be achieved whilst the gas and electron supply remain the same. In this case the processing speed was increased by a factor of 5.

Further advantages and embodiments of the invention are the subject matter of the subordinate claims and are explained in greater detail below on the basis of several embodiments.

Figure 4:
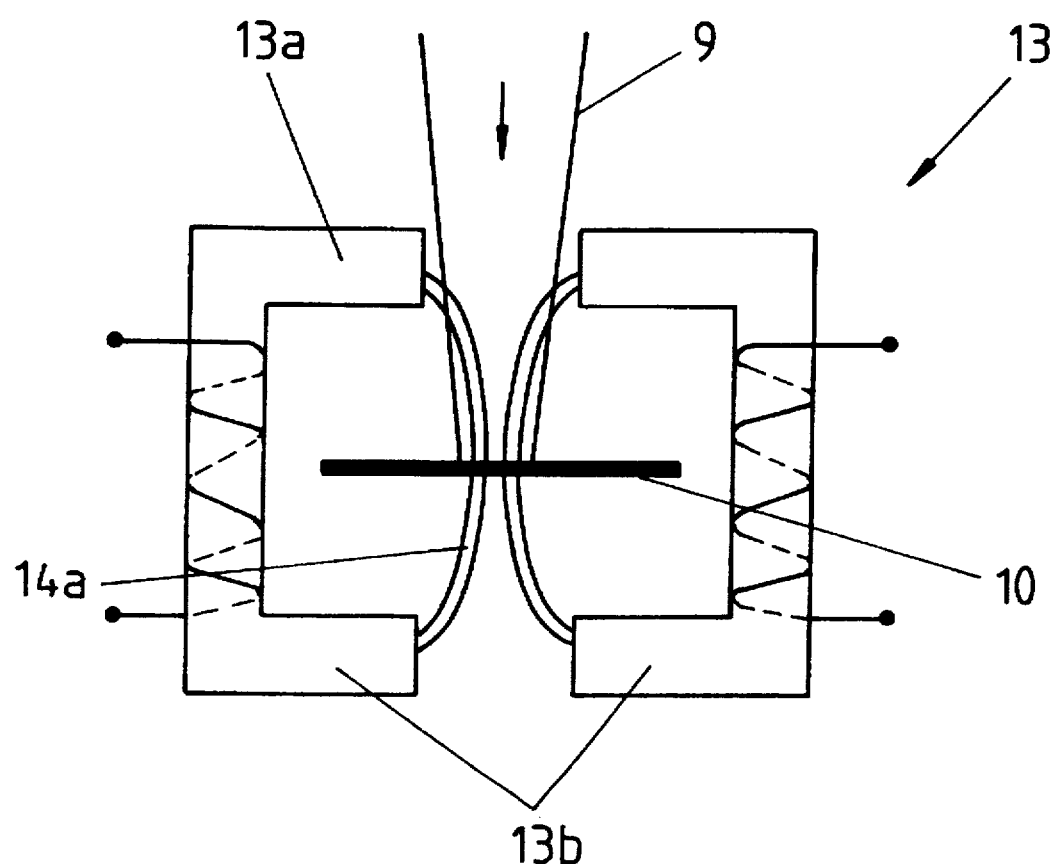
Figure 5:
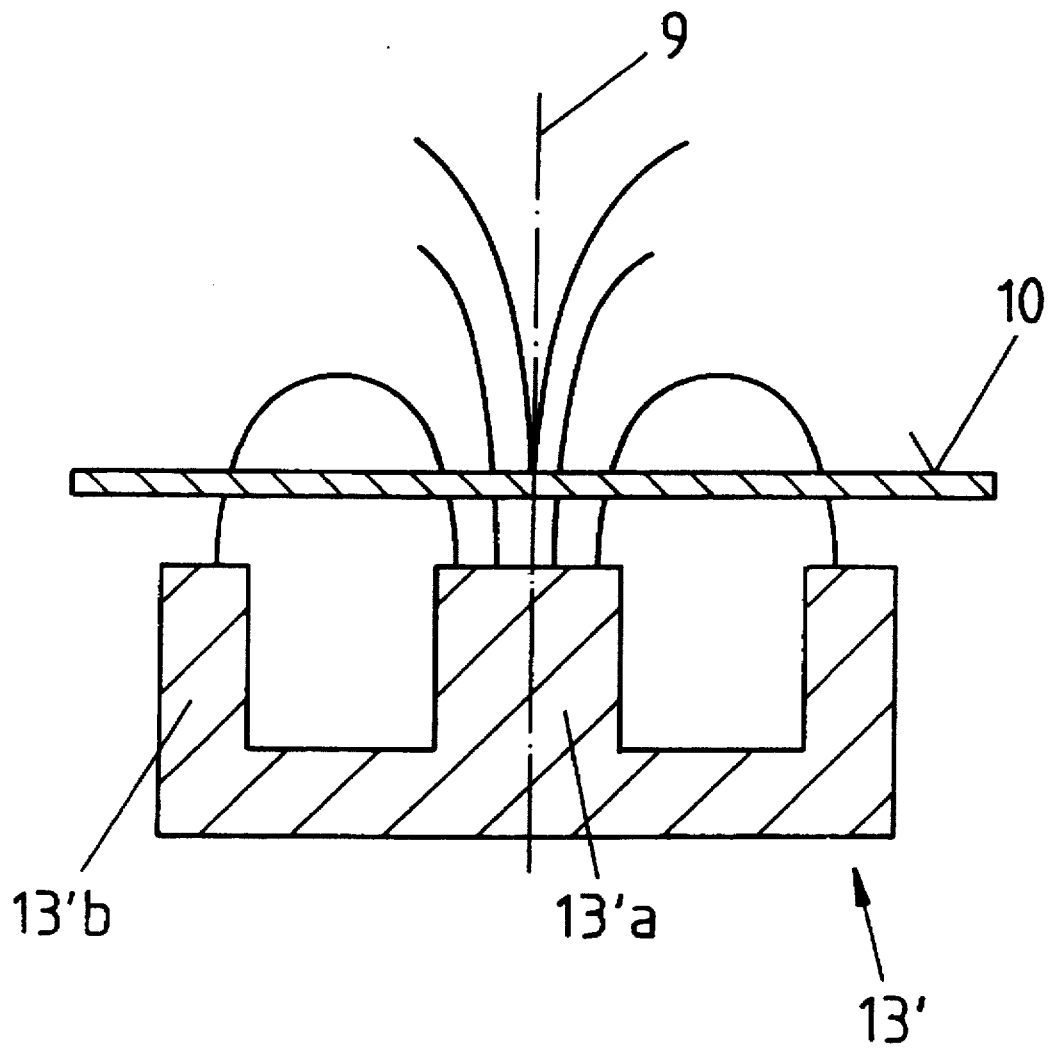
Figure 6:
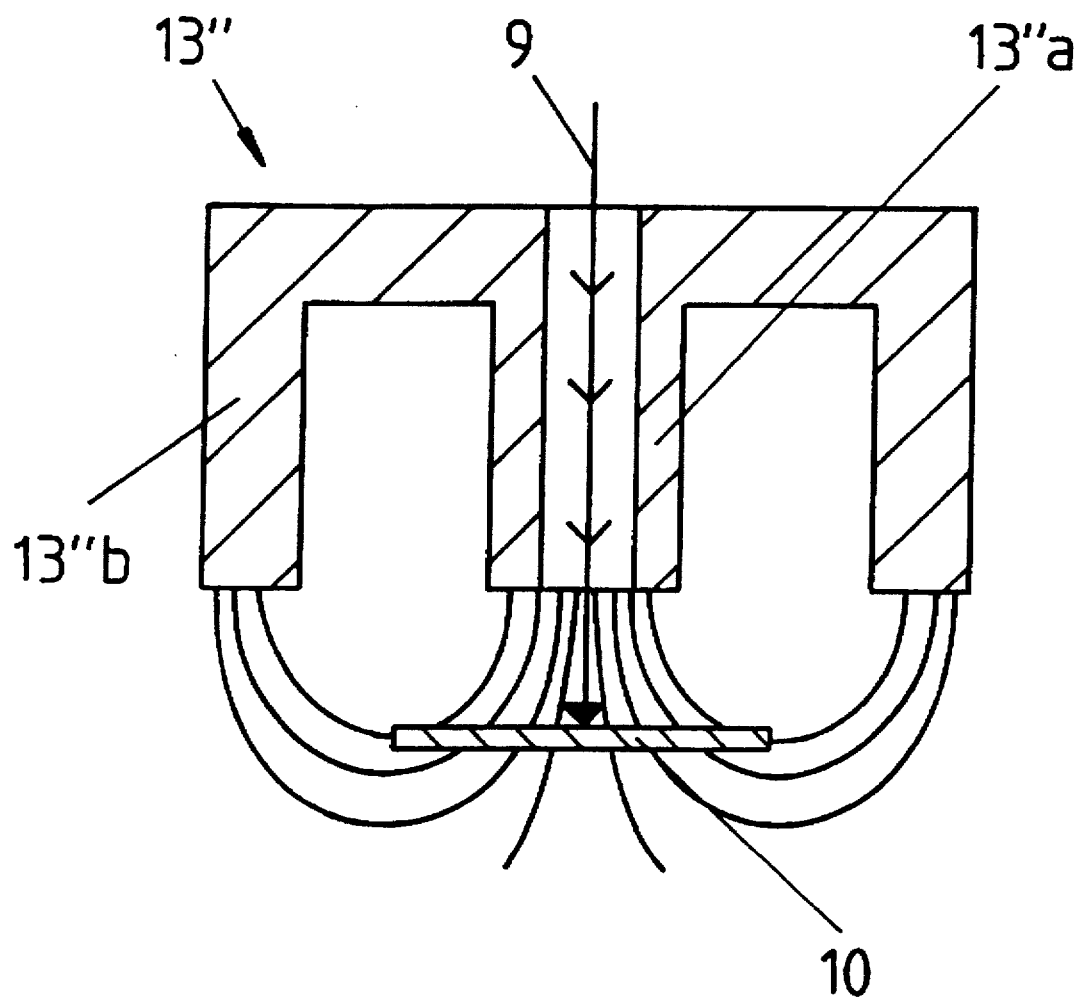
Figure 1:
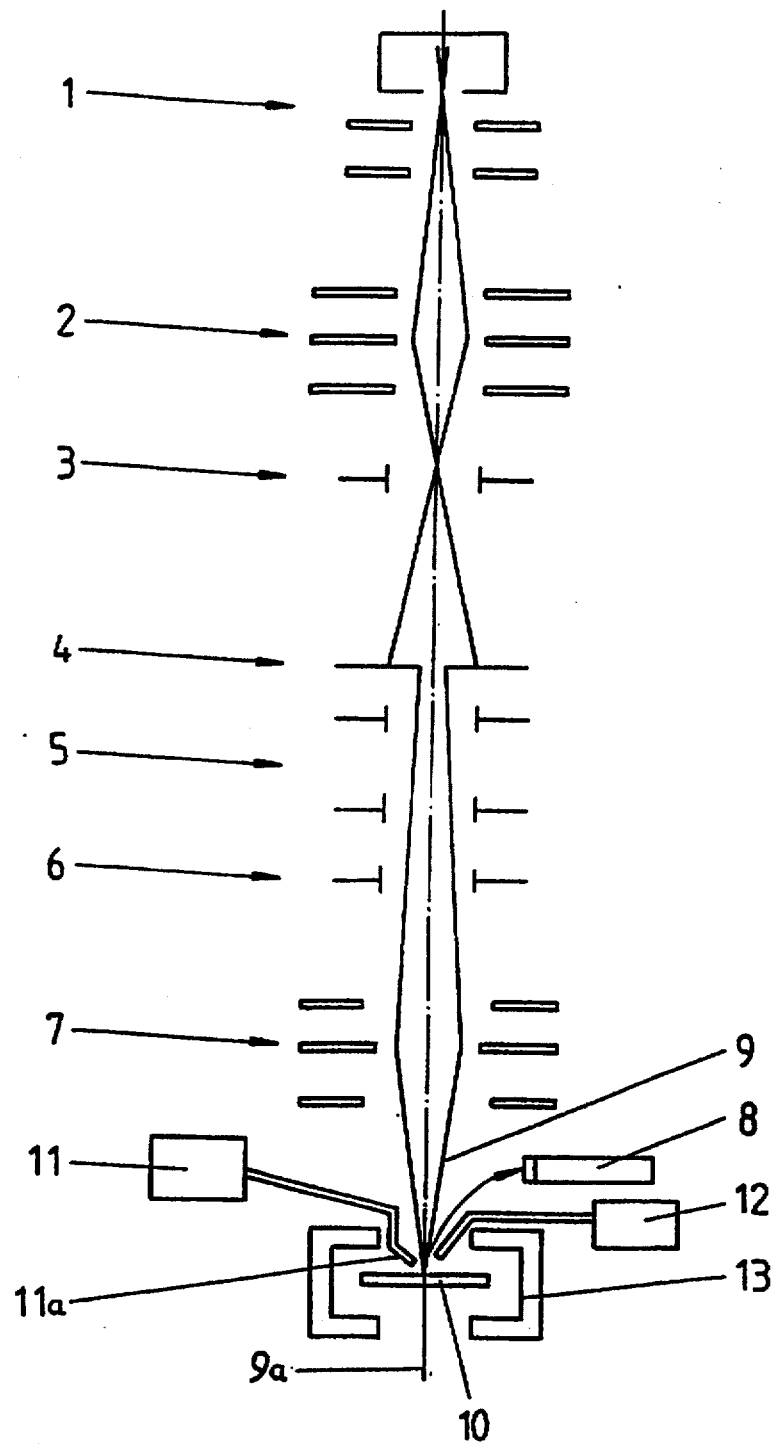

In the drawings:

FIG. 1 shows a schematic view of a corpuscular beam device with an arrangement for producing a magnetic field, FIG. 2a shows a schematic representation of the operations in the region of the specimen without using a magnetic field, as well as the resulting distribution of the material being deposited on the specimen, FIG. 2b shows a distribution characteristic of the material being deposited on the specimen, FIG. 3a shows a schematic representation of the operations in the region of the specimen using a magnetic field, FIG. 3b shows a distribution characteristic of the material being deposited on the specimen, FIG. 4 shows a schematic representation of a first embodiment of an arrangement for producing a magnetic field, FIG. 5 shows a schematic representation of a second embodiment of an arrangement for producing a magnetic field, and FIG. 6 shows a schematic representation of a third embodiment of an arrangement for producing a magnetic field.

The corpuscular beam device shown in FIG. 1 comprises an arrangement for producing a corpuscular beam, for example an electron source 1, a condenser lens 2, a blanking system 3, an aperture diaphragm 4, a deflecting arrangement 5, a stigmator 6 as well as an objective lens 7.

A secondary electron spectrometer, which essentially comprises an extraction and filter electrode (not shown in greater detail) and a secondary electron detector 8, is also integrated into this arrangement.

The electron beam 9 focussed in the arrangement strikes a specimen 10 to be processed which is accommodated in an evacuable specimen chamber in a suitable holder. The holder, which is not shown in greater detail, is preferably movable in at least two axes extending perpendicular to the beam direction 9a.

Furthermore an arrangement 11 for supplying gas is provided, the nozzle orifice 11a of this arrangement being disposed above the area of the specimen 10 to be processed.

An arrangement 12 for drawing off gases is also provided in this region, and the way in which it functions will be explained below.

Finally, an arrangement 13 for producing a magnetic field is provided in the region of the specimen.

The method according to the invention will be explained in greater detail below with the aid of FIGS. 2 and 3.

In FIG. 2a the conventional method of applying material to the specimen 10 is shown, in which a gas is used by means of which after interaction with the corpuscular beam 9 material is deposited on the specimen 10.

FIG. 2b the number n of deposited particles 15 or the thickness of the deposited material layer is plotted relative to the location x for this method. In this case it can be clearly recognized that in the area a of the specimen 10, which area is to be processed and is covered by the electron beam 9, a markedly increased deposition of material occurs. However, it can also be seen that in the areas of the specimen 10 not covered by the electron beam 9 a not inconsiderable deposition of material takes place.

From the tests on which the invention is based it has been shown that by the use of a magnetic field 14 in the region of the specimen 10 a marked increase in the rate of deposition can be achieved whilst the other external conditions remain the same, cf. FIGS. 3a and 3b. In the tests a rate of increase by a factor of 5 was achieved.

Depending upon the gas used the particles 15 deposited on the surface of the specimen 10 react differently. If for example the gas $W(CO)_6$ is used, then tungsten is deposited as a solid material layer on the specimen. On the other hand, if for example $XeF_2$ is used as the gas, then the fluorine with the silicon of the specimen 10 forms the volatile $SiF_4$. This volatile reaction product is drawn off via the arrangement 12 for drawing off gases (FIG. 1). When this gas is used material can also be removed from the specimen. The illustrations and explanations relating to FIGS. 2 and 3 equally apply to the removal of material from the specimen 10. The difference is merely that the particles being deposited do not form a solid layer but rather they form a volatile reaction product with the specimen material.

A first embodiment of an arrangement 13 for producing a magnetic field is illustrated in FIG. 4. It can be formed for example by a permanent magnet or, as illustrated, by an electromagnet. In the present embodiment the specimen 10 is disposed in the interior of the arrangement 13 for producing a magnetic field. In this case the electron beam 9 passes through a central opening in the upper pole piece 13a onto the area of the specimen 10 to be processed. The magnetic field lines 14a between the upper and lower pole piece 13a, 13b extend approximately perpendicular to the surface of the specimen 10.

A second embodiment of an arrangement 13' for producing a magnetic field is illustrated in FIG. 5. The arrangement 13' is disposed below the specimen 10 and has a central pole 13'a and an outer pole 13'b disposed concentrically therewith.

The magnetic field produced by such an arrangement can be used, apart from the method according to the invention, for the focussing of the electron beam 9. In this case the arrangement 13' for producing a magnetic field simultaneously forms a so-called "single pole lens".

Finally, FIG. 6 shows a third embodiment of an arrangement 13" for producing a magnetic field, which arrangement is disposed above the specimen 10 and has a central pole 13"a as well as an outer pole 13"b disposed concentrically therewith. The central pole 13"a has a central passage for the electron beam 9.

This arrangement 13" for producing a magnetic field can also simultaneously form the objective lens 7 of FIG. 1 or a part thereof.

The arrangements for producing a magnetic field shown in FIGS. 4 to 6 are merely to be understood as examples and can also be of different construction depending upon the application. Thus in particular it may be advantageous for an electrical field to be additionally superimposed on the magnetic field.

We claim:

1. Method of processing a specimen (10), particularly an integrated circuit, in which an area of the specimen (10) to be processed is scanned with a corpuscular beam, particularly an electron beam, and at least one gas is supplied above the area to be processed, so that with the aid of the corpuscular beam a chemical reaction takes place on the area to be processed, characterised by the use of a magnetic field (14) in the region of the specimen.

2. Method as claimed in claim 1, characterised in that the strength of the magnetic field (14) can be adjusted.

3. Method as claimed in claim 1 or 2, characterised by the use of an electrical field superimposed on the magnetic field (14).

4. Method as claimed in claim 3 characterised in that in order to apply material to the specimen at least one gas is used by means of which after interaction with the corpuscular beam material is deposited on the specimen.

* * * * *

UNITED STATES PATENT AND TRADEMARK OFFICE
CERTIFICATE OF CORRECTION

PATENT NO. : 5,637,538

DATED : June 10, 1997

INVENTOR(S) : Jurgen Frosien, et al

It is certified that error appears in the above-indentified patent and that said Letters Patent is hereby corrected as shown below:

The drawing sheet consisting of Fig. 1, should be deleted to be replaced with drawing sheet consisting of Fig. 1, as shown on the attached page.

Add the following as Claim 5:

5. Method as claimed in claim 3, characterized in that in order to remove material from the specimen at least one gas is used by means of which after interaction with the corpuscular beam material is removed from the specimen.

Signed and Sealed this

Nineteenth Day of August, 1997

Attest:

BRUCE LEHMAN

Attesting Officer

Commissioner of Patents and Trademarks